United States Patent
Cao et al.

(10) Patent No.: US 12,067,920 B1
(45) Date of Patent: Aug. 20, 2024

(54) LINE SCANNING UNIT, LINE-SCANNING CASCADE CIRCUIT, AND DRIVING METHOD

(71) Applicant: HKC CORPORATION LIMITED, Shenzhen (CN)

(72) Inventors: Zhonglin Cao, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/513,662

(22) Filed: Nov. 20, 2023

(30) Foreign Application Priority Data

Apr. 18, 2023 (CN) .......................... 202310461107.5

(51) Int. Cl.
*G09G 3/20* (2006.01)
*H01L 27/12* (2006.01)

(52) U.S. Cl.
CPC ............. *G09G 3/20* (2013.01); *H01L 27/124* (2013.01); *G09G 2310/0267* (2013.01); *G09G 2310/0286* (2013.01)

(58) Field of Classification Search
USPC ........................................................ 345/213
See application file for complete search history.

(56) References Cited

U.S. PATENT DOCUMENTS

| | | | | |
|---|---|---|---|---|
| 2016/0253975 A1* | 9/2016 | Yang | .................... | G09G 3/3677 345/58 |
| 2017/0301295 A1* | 10/2017 | Park | .................... | G09G 3/3258 |
| 2017/0309240 A1* | 10/2017 | Zhang | .................... | G11C 19/28 |
| 2018/0047327 A1* | 2/2018 | Wang | .................... | G11C 19/184 |
| 2019/0325845 A1* | 10/2019 | Zhu | .................... | G09G 3/2074 |
| 2020/0258464 A1* | 8/2020 | Wang | .................... | H04M 1/0266 |
| 2020/0265877 A1* | 8/2020 | Zheng | .................... | G11C 19/28 |
| 2021/0209987 A1* | 7/2021 | Feng | .................... | G09G 3/20 |
| 2021/0335208 A1* | 10/2021 | Chen | .................... | G09G 3/3266 |
| 2021/0335263 A1* | 10/2021 | Byun | .................... | G09G 5/10 |
| 2021/0335317 A1* | 10/2021 | Liu | .................... | G09G 3/3674 |
| 2022/0199029 A1* | 6/2022 | Xiao | .................... | G09G 3/3266 |
| 2022/0208072 A1* | 6/2022 | Jin | .................... | G09G 3/2092 |

* cited by examiner

*Primary Examiner* — Chineyere D Wills-Burns

(57) ABSTRACT

A line scanning unit, a line-scanning cascade circuit, and a driving method thereof are disclosed. The unit includes: an input module for pulling-up a voltage of a first node to be at high potential; an output module for receiving a first clock signal and outputting an output signal via a signal output terminal; a pull-down maintenance control module for pulling-up a voltage of a second node to be at high potential; a maintaining module for pulling-down voltages of the signal output terminal and the first node to be at low potential; a pull-down module for pulling-down the voltage of the second node to be at low potential; a first reset module for pulling-down the voltage of the first node to be at low potential; a second reset module for pulling-down the voltages of the first node, the second node, and the signal output terminal to be at low potential.

20 Claims, 6 Drawing Sheets

LINE SCANNING UNIT, LINE-SCANNING CASCADE CIRCUIT, AND DRIVING METHOD

CROSS REFERENCE TO RELATED APPLICATIONS

The present disclosure claims priority to Chinese Patent Application No. 202310461107.5 filed on Apr. 18, 2023, the contents of which are herein incorporated by reference in their entireties.

TECHNICAL FIELD

Embodiments of the present disclosure relate to the field of display technology, in particular to a line scanning unit and line-scanning cascade circuit and driving method.

BACKGROUND

In the field of display technology, Gate Driven on Array (GOA) technology refers to a technology that outputs Gate shift waveforms by integrating Thin Film Transistors (TFTs) into a display glass substrate. The GOA technology can replace the function of Gate driver IC, thus eliminating the Gate driver IC and a manufacturing process thereof, and greatly saving the cost of the substrate. The GOA technology can achieve a further simplified design and an effect of narrow bezel in high mobility semiconductor technologies such as Oxide/low temperature polycrystalline silicon (LTPS).

Nowadays, the GOA technology has become an important and widely used technology in the field of display technology. However, the TFT is easily affected by water vapor and then deteriorated, and the Oxide TFT has a low leakage current and charges are easily retained in the field of Oxide semiconductor.

Therefore, it is necessary to consider the characteristics of Oxide for GOA circuit design when the GOA technology is applied to Oxide semiconductor technology.

SUMMARY

A first technical solution provided by some embodiments of the present disclosure is to provide a line scanning unit, which includes an input module, an output module, a pull-down maintaining control module, a maintaining module, a pull-down module, a first reset module and a second reset module: the input module is configured to pull-up a voltage of a first node to be at high potential according to a $(N-1)^{th}$ transmission signal, and the N is an integer greater than 1: the output module is configured to receive a first clock signal and output an output signal via a signal output terminal in response to the voltage of the first node being at high potential: the pull-down maintaining control module is configured to pull-up a voltage of a second node to be at high potential: the maintaining module, configured to pull-down a voltage of the signal output terminal and the voltage of the first node to be at low potential in response to the voltage of the second node being at high potential: the pull-down module is configured to pull-down the voltage of the second node to be at low potential: the first reset module is configured to pull down the voltage of the first node to be at low potential according to a $(N+2)^{th}$ transmission signal: the second reset module is configured to pull-down the voltage of the first node, the voltage of the second node, and the voltage of the signal output terminal to be at low potential according to a second clock signal.

A second technical solution provided by some embodiments of the present disclosure is to provide a line-scanning cascade circuit, the line-scanning cascade circuit may include the above line scanning unit.

A third technical solution provided by some embodiments of the present disclosure is to provide a driving method of the line scanning unit, the line scanning unit is the above-mentioned line scanning unit, and the driving method has a driving sequence including an input stage, a first output stage, a second output stage, a reset stage, and a blank stage; and the blank stage may include a first time period and a second time period: the driving method may include that in the input stage, the $(N-1)^{th}$ transmission signal is configured to be the high potential, the first clock signal, the second clock signal, and the $(N+2)^{th}$ transmission signal are configured to be at low potential: the input module is configured to pull-up the voltage of the first node to be at high potential, and the pull-down module is configured to pull-down the voltage of the second node to be at low potential: in the first output stage, the first clock signal is configured to be at high potential, the second clock signal, the $(N-1)^{th}$ transmission signal, and the $(N+2)^{th}$ transmission signal are configured to be low potential, and the output module is configured to output a high potential signal to the signal output terminal: in the second output stage, the first clock signal, the second clock signal, the $(N-1)^{th}$ transmission signal, and the $(N+2)^{th}$ transmission signal are configured to be at low potential, and the output module is configured to output a low potential signal to the signal output terminal: in the reset stage, the first clock signal and the $(N+2)^{th}$ transmission signal are configured to be at high potential, and the second clock signal and the $(N-1)^{th}$ transmission signal are configured to be at low potential: the first reset module is configured to pull-down the voltage of the first node from the high potential to the low potential, the pull-down module is configured to stop operation such that the pull-down maintaining control module pulls-up the voltage of the second node from the low potential to the high potential, and the maintaining module is configured to continuously pull down and maintain the voltage of the first node and the voltage of the signal output terminal be at low potential: in the blank stage, the first clock signal, the $(N-1)^{th}$ transmission signal, and the $(N+2)^{th}$ transmission signal are configured to be at low potential: in the first time period, the second clock signal is configured to be at high potential, and the first node and the signal output terminal are configured to be discharged through the second reset module: in the second time period, the second clock signal is configured to be at low potential.

BRIEF DESCRIPTION OF THE DRAWINGS

In order to more clearly illustrate technical solutions in embodiments of the disclosure, a brief description of the drawings required in the description of the embodiments will be given below. Obviously, the drawings described below are only some embodiments of the present disclosure, and other drawings can be obtained by those skilled in the art according to these drawings without any creative work.

DETAILED DESCRIPTIONS

The technical solutions of the embodiments of the present disclosure will be described in detail below in conjunction with the accompanying drawings.

In the following description, for purposes of illustration rather than limitation, specific details, such as specific system architectures, interfaces, and techniques, are set forth in order to provide a thorough understanding of the present disclosure.

The following will clearly and completely describe the technical solutions in the embodiments of the present disclosure in conjunction with the accompanying drawings in the embodiments of the present disclosure. Obviously, the described embodiments are only part of the embodiments of the present disclosure, not all of them. Based on the embodiments of the present disclosure, all other embodiments acquired by those skilled in the art without creative work shall fall within the scope of protection in the present disclosure.

The terms "first", "second", and "third" in the present disclosure are used for descriptive purposes only, and cannot be understood as indicating or implying relative importance or implicitly specifying the quantity of indicated technical features. Thus, features defined as "first", "second", and "third" may explicitly or implicitly include at least one of these features. In the description of the present disclosure, "a plurality of" means at least two, such as two, three, etc., unless otherwise specifically defined. All directional indications (such as up, down, left, right, front, back . . . ) in the embodiments of the present disclosure are only used to explain the relative positional relationships, movements, etc., of components in a certain posture (as shown in the figure), and if the specific posture is changed, the directional indications are also changed accordingly. Furthermore, the terms "include", "have", and any variations thereof, are intended to cover a non-exclusive inclusion. For example, a process, method, system, product, or device including a series of operations or units is not limited to the listed operations or units, but optionally also includes unlisted operations or units, or optionally further includes other operations or units inherent in the process, method, product, or device.

Reference to "embodiment" in the present disclosure means that, specific features, structures, or characteristics described in conjunction with the embodiments may be included in at least one embodiment of the present disclosure. The presence of the phrase at each location in the specification does not necessarily refer to the same embodiment, nor is it a separate or alternative embodiment that is mutually exclusive with other embodiments. It is understood, both explicitly and implicitly, by those skilled in the art that embodiments described herein may be combined with other embodiments.

Figure 1:
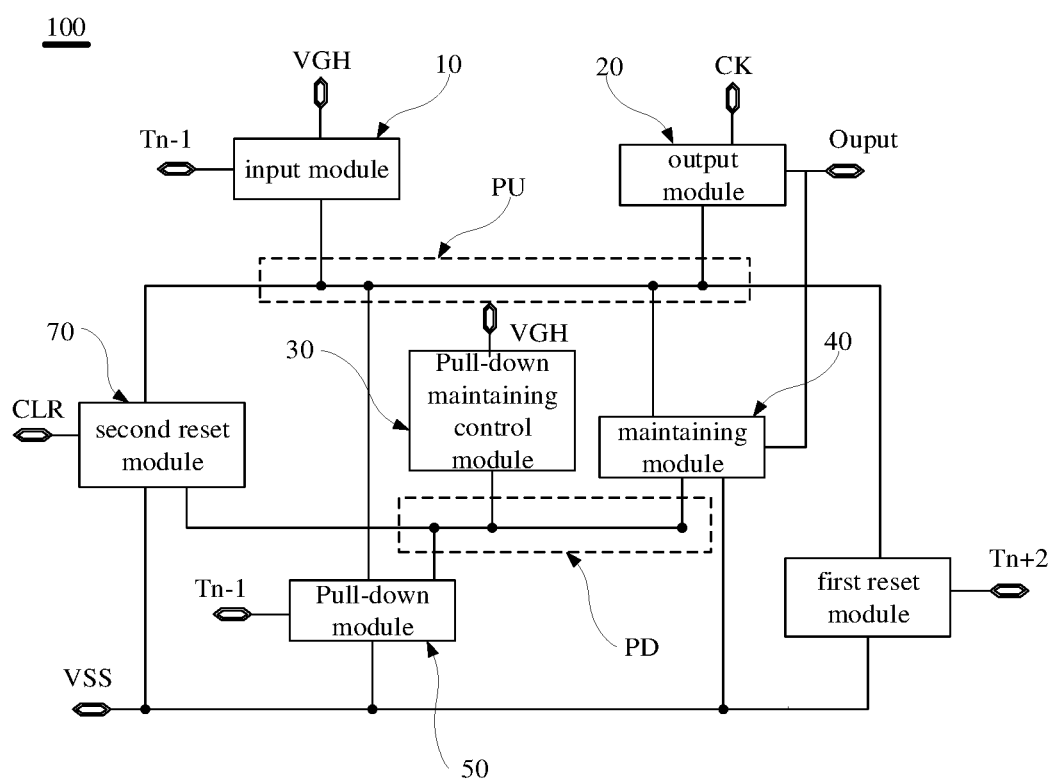
FIG. 1 is a schematic module view of a line scanning unit provided by some embodiments of the present disclosure.

FIG. 1 is a schematic module view of a line scanning unit provided by some embodiments of the present disclosure.

Some embodiments of the present disclosure provide a line scanning unit 100. The line scanning unit 100 includes an input module 10, an output module 20, a pull-down maintaining control module 30, a maintaining module 40, a pull-down module 50, a first reset module 60, and a second reset module 70. The input module 10 is configured to pull-up the voltage of a first node PU to be at a high potential according to an $(N-1)^{th}$ transmission signal Tn−1, and the N is an integer greater than 1. The output module 20 is configured to receive a first clock signal CK and output an output signal Ouput to a signal output terminal Ouput in response to the voltage of the first node PU being at a high potential. The pull-down maintaining control module 30 is configured to pull-up the voltage of a second node PD to be at high potential. The maintaining module 40 is configured to pull-down the voltage of the signal output terminal Ouput and the voltage of the first node PU to be at low potential in response to the voltage of the second node PD being at high potential. The pull-down module 50 is configured to pull down the voltage of the second node PD to be at low potential. The first reset module 60 is configured to pull down the voltage of the first node PU to be at low potential according to an $(N+2)^{th}$ transmission signal Tn+2. The second reset module 70 is configured to pull down the voltage of the first node PU, the voltage of the second node PD, and the voltage of the signal output terminal Ouput to be at low potential according to a second clock signal CLR.

In some embodiments, a control terminal of the input module 10 may be configured to receive the $(N-1)^{th}$ transmission signal Tn−1, an input terminal of the input module 10 may be configured to receive the constant-voltage high-potential signal VGH, an output terminal of the input module 10 may be connected to the first node PU.

A control terminal of the output module 20 may be connected to the first node PU, an input terminal of the output module 20 may be configured to receive the first clock signal CK, and an output terminal of the output module 20 may be connected to the signal output terminal Ouput.

A control terminal of the pull-down maintaining control module 30 may be configured to receive the constant-voltage high-potential signal VGH, an input terminal of the pull-down maintaining control module 30 may be configured to receive the constant-voltage high-potential signal VGH, and an output terminal of the pull-down maintaining control module 30 may be connected to the second node PD.

A control terminal of the maintaining module 40 may be connected to the second node PD, an input terminal of the maintaining module 40 may be connected to the signal input terminal and the first node PU, and an output terminal of the maintaining module 40 may be configured to receive the constant-voltage low-potential signal VSS.

A control terminal of the pull-down module 50 may be connected to the first node PU and the $(N-1)^{th}$ transmission signal Tn−1, an input terminal of the pull-down module 50 may be connected to the second node PD, and an output terminal of the pull-down module 50 may be configured to receive the constant-voltage low-potential signal VSS.

A control terminal of the first reset module 60 may be configured to receive the $(N+2)^{th}$ transmission signal Tn+2, an input terminal of the first reset module 60 may be connected to the first node PU, and an output terminal of the first reset module 60 may be configured to receive the constant-voltage low-potential signal VSS.

A control terminal of the second reset module 70 may be configured to receive the second clock signal CLR, an input terminal of the second reset module 70 may be connected to the first node PU and the signal output terminal Ouput, and an output terminal of the second reset module 70 may be configured to receive the constant-voltage low-potential signal VSS.

Figure 3:
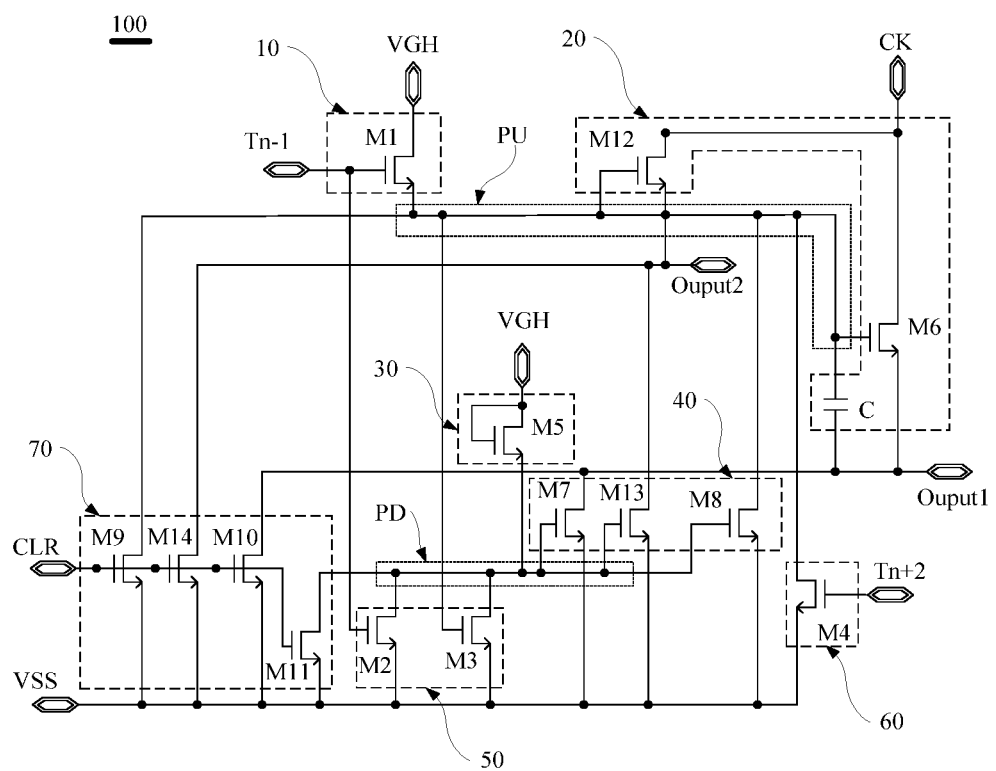
FIG. 3 is a schematic structural view of a line scanning unit provided by another some embodiments of the present disclosure.

It is noted that, the signal output terminal Ouput may include a first output terminal Ouput1, the first output terminal Ouput1 may be configured to output a $N^{th}$ gate driving signal Gn. Alternatively, the signal output terminal Ouput may include a first output terminal Ouput and a second output terminal Ouput2 (as shown in FIG. 3), the first output Ouput1 may be configured to output the $N^{th}$ gate driving signal Gn, and the second output Ouput2 may be configured to output a $N^{th}$ transmission signal Tn.

When the signal output terminal Ouput include the first output terminal Ouput1, the first output terminal Ouput1 may be configured to output not only the $N^{th}$ gate driving signal Gn, but also the $N^{th}$ transmission signal Tn.

In some embodiments, the signal output terminal Ouput include the first output terminal Ouput1, the first output terminal Ouput1 is configured to output the $N^{th}$ gate driving signal Gn and the $N^{th}$ transmission signal Tn.

Figure 2:
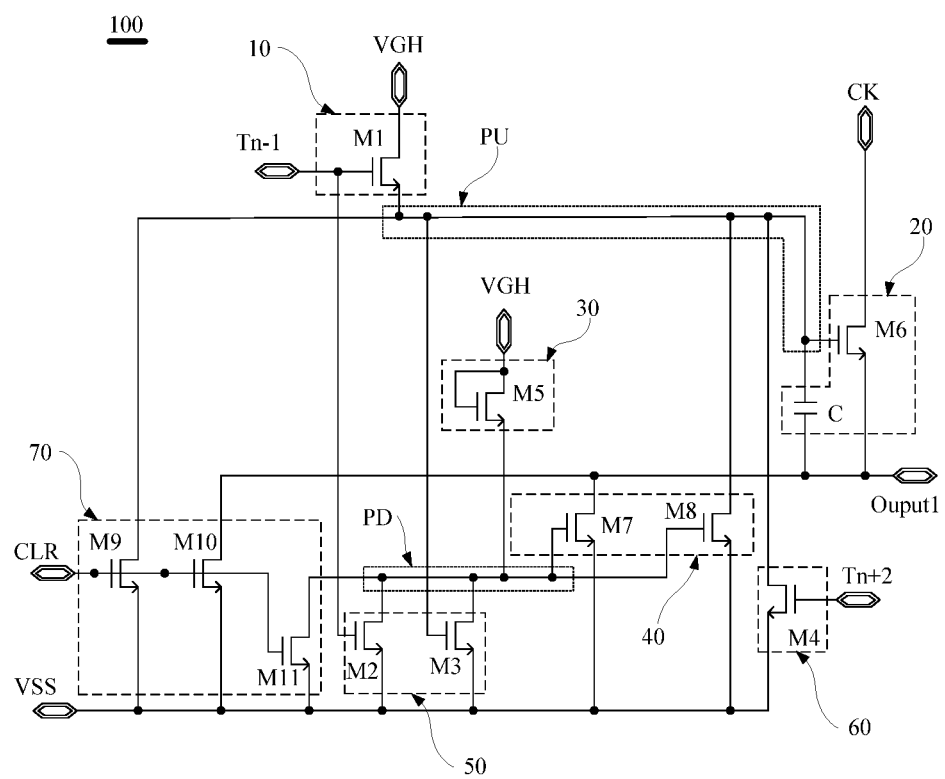
FIG. 2 is a schematic structural view of a line scanning unit provided by some embodiments of the present disclosure.

As shown in FIG. 1 and FIG. 2, FIG. 2 is a schematic structural view of a line scanning unit provided by some embodiments of the present disclosure, the input module 10 may include a first transistor M1, a gate of the first transistor M1 may be configured to receive the $(N-1)^{th}$ transmission signal Tn−1, a drain of the first transistor M1 may be configured to receive the constant-voltage high-potential signal VGH, and a source of the first transistor M1 may be connected to the first node PU.

The pull-down module 50 may include a second transistor M2 and a third transistor M3, a gate of the second transistor M2 may be configured to receive the $(N-1)^{th}$ transmission signal Tn−1, and a drain of the second transistor M2 may be connected to the second node PD, a source of the second transistor M2 may be configured to receive the constant-voltage low-potential signal VSS: a gate of the third transistor M3 may be connected to the first node PU, a drain of the third transistor M3 may be connected to the second node PD, a source of the third transistor M3 may be configured to receive the constant-voltage low-potential signal VSS.

The first reset module 60 may include a fourth transistor M4, a gate of the fourth transistor M4 may be configured to receive the $(N+2)^{th}$ transmission signal Tn+2, a drain of the fourth transistor M4 may be connected to the first node PU, and a source of the fourth transistor M4 may be configured to receive the constant-voltage low-potential signal VSS.

The pull-down maintaining control module 30 may include a fifth transistor M5, a gate and a drain of the fifth transistor M5 may be configured to receive the constant-voltage high-potential signal VGH, and a source of the fifth transistor M5 may be connected to the second node PD.

The output module 20 may include a sixth transistor M6 and a capacitor C, a gate of the sixth transistor M6 may be connected to the first node PU, a drain of the sixth transistor M6 may be configured to receive the first clock signal, a source of the sixth transistor M6 may be connected to the first output terminal: one terminal of the capacitor C may be connected to the first node PU, the other terminal of the capacitor C may be connected to the first output terminal.

The maintaining module 40 may include a seventh transistor M7 and an eighth transistor M8, a gate of the seventh transistor M7 may connected to the second node PD, a drain of the seventh transistor M7 may be connected to the first output terminal, a source of the seventh transistor M7 may be configured to receive the constant-voltage low-potential signal VSS: a gate of the eighth transistor M8 may be connected to the second node PD, a drain of the eighth transistor M8 may be connected to the first node PU, a source of the eighth transistor M8 may be configured to receive the constant-voltage low-potential signal VSS.

The second reset module 70 may include a ninth transistor M9, a tenth transistor M10, and an eleventh transistor M11, a gate of the ninth transistor M9 may be configured to receive the second clock signal, a drain of the ninth transistor M9 may be connected to the first node PU, a source of the ninth transistor M9 may connected to the constant-voltage low-potential signal VSS: a gate of the tenth transistor M10 may be configured to receive the second clock signal, a drain of the tenth transistor M10 may be connected to the first output terminal, a source of the tenth transistor M10 may be configured to receive the constant-voltage low-potential signal VSS: a gate of the eleventh transistor M11 may be configured to receive the second clock signal, a drain of the eleventh transistor M11 may be connected to the second node PD, a source of the eleventh transistor M11 may be configured to receive the constant-voltage low-potential signal VSS.

In some embodiments, the first transistor, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13 and the fourteenth transistor M14 may all be oxide thin film transistors.

In some embodiments, at least one of the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13 and the fourteenth transistor M14 can be other type of transistor, there are no excessive restrictions here.

In some embodiments of the present disclosure, the cost of the Gate driver IC can be effectively saved by replacing the Gate driver IC with the line scanning unit 100. The line scanning unit 100 in some embodiments includes 11 transistors, and the output function of the line scanning unit 100 can be realized with less transistors, so that narrowing the bezels of the products. The line scanning unit 100 in some embodiments combines the characteristic of high mobility of the Oxide. The sizes of the transistors can be smaller than amorphous silicon transistors, when used in Oxide products, the bezels of the products are able to be further narrowed while reliability is ensured. In some embodiments, by replacing the $N^{th}$ transmission signal Tn (that is, the local transmission signal of this line scanning unit) with the $N^{th}$ gate driving signal Gn (that is, the local gate driving signal of this line scanning unit), which is configured as a signal transmitted between different line scanning units 100, the number of the transistors and signal lines is further optimized, and the bezels of the products is realized be more narrowed. In some embodiments, by using the maintaining module 40, the first reset module 60, and the second reset module 70, the residual charges in the line scanning unit 100 is released, so that the whole line scanning unit 100 can be reset faster and better, improving the low leakage current problem of the oxide thin film transistor (TFT) and reducing the retained charges.

As shown in FIG. 1, FIG. 2 and FIG. 3, FIG. 3 is a schematic structural view of a line scanning unit provided by another some embodiments of the present disclosure, the line scanning unit 100 herein is basically similar in structure to the line scanning unit 100 provided above, except that: the signal output terminal Ouput includes not only the first output terminal Ouput1, but also the second output terminal Ouput2, the second output terminal Ouput2 is configured to output the $N^{th}$ transmission signal Tn.

In some embodiments, the signal output terminal Ouput may include the first output terminal Ouput1 and the second output terminal Ouput2, the first output terminal Ouput1 may be configured to output the $N^{th}$ gate driving signal Gn, and the second output terminal Ouput2 may be configured to output the $N^{th}$ transmission signal Tn.

The input module 10 may include a first transistor M1, a gate of the first transistor M1 may be configured to receive the $(N-1)^{th}$ transmission signal Tn-1, a drain of the first transistor M1 may be configured to receive the constant-voltage high-potential signal VGH, and a source of the first transistor M1 may be connected to the first node PU.

The pull-down module 50 may include a second transistor M2 and the third transistor M3, a gate of the second transistor M2 may be configured to receive the $(N-1)^{th}$ transmission signal Tn-1, a drain of the second transistor M2 may be connected to the second node PD, and a source of the second transistor M2 may be configured to receive the constant-voltage low-potential signal VSS. A gate of the third transistor M3 may be connected to the first node PU, a drain of the third transistor M3 may be connected to the second node PD, and a source of the third transistor M3 may be configured to receive the constant-voltage low-potential signal VSS.

The first reset module 60 may include a fourth transistor M4, a gate of the fourth transistor M4 may be configured to receive the $(N+2)^{th}$ transmission signal Tn+2, a drain of the fourth transistor M4 may be connected to the first node PU, and a source of the fourth transistor M4 may be configured to receive the constant-voltage low-potential signal VSS.

The pull-down maintaining control module 30 may include a fifth transistor M5, a gate of the fifth transistor M5 and a drain of the fifth transistor M5 may be configured to receive the constant-voltage high-potential signal VGH, and a source of the fifth transistor M5 may be connected to the second node PD.

The output module 20 may include a sixth transistor M6 and a capacitor C, a gate of the sixth transistor M6 may be connected to the first node PU, a drain of the sixth transistor M6 may be configured to receive the first clock signal CK, and a source of the sixth transistor M6 may be connected to the first output terminal Ouput1. One terminal of the capacitor C may be connected to the first node PU, and the other terminal may be connected to the first output terminal Ouput1. In addition to the sixth transistor M6 and the capacitor C, the output module 20 may also include a twelfth transistor M12. A gate of the twelfth transistor M12 may be connected to the first node PU, a drain of the twelfth transistor M12 may be configured to receive the first clock signal CK, and a source of the twelfth transistor M12 may be connected to the first node PU and connected to the second output terminal Ouput2 through the first node PU.

The maintaining module 40 may include a seventh transistor M7 and an eighth transistor M8, a gate of the seventh transistor M7 may be connected to the second node PD, a drain of the seventh transistor M7 may be connected to the first output terminal Ouput1, and a source of the seventh transistor M7 may be configured to receive the constant-voltage low-potential signal VSS. A gate of the eighth transistor M8 may be connected to the second node PD, a drain of the eighth transistor M8 may be connected to the first node PU, and a source of the eighth transistor M8 may be configured to receive the constant-voltage low-potential signal VSS. In addition to the seventh transistor M7 and the eighth transistor M8, the maintaining module 40 may also include a thirteenth transistor M13, a gate of the thirteenth transistor M13 may be connected to the second node PD, a drain of the thirteenth transistor M13 may be connected to the second output Ouput2, and a source of the thirteenth transistor M13 may be configured to receive the constant-voltage low-potential signal VSS.

the second reset module 70 may include a ninth transistor M9, a tenth transistor M10, and an eleventh transistor M11, a gate of the ninth transistor M9 may be configured to receive the second clock signal CLR, a drain of the ninth transistor M9 may be connected to the first node PU, a source of the ninth transistor M9 may be configured to receive the constant-voltage low-potential signal VSS: a gate of the tenth transistor M10 may be configured to receive the second clock signal CLR, a drain of the tenth transistor M10 may be connected to the first output terminal Ouput1, a source of the tenth transistor M10 may be configured to receive the constant-voltage low-potential signal VSS: a gate of the eleventh transistor M11 may be configured to receive the second clock signal CLR, a drain of the eleventh transistor M11 may be connected to the second node PD, a source of the eleventh transistor M11 may be configured to receive the constant-voltage low-potential signal VSS. In addition to the ninth transistor M9, the tenth transistor M10 and the eleventh transistor M11, the second reset module 70 may also include a fourteenth transistor M14, a gate of the fourteenth transistor M14 may be configured to receive the second clock signal CLR, a drain of the fourteenth transistor M14 may be connected to the second output terminal Ouput2, and a source of the fourteenth transistor M14 may be configured to receive the constant-voltage low-potential signal VSS.

In some embodiments, the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13 and the fourteenth transistor M14 are all oxide thin film transistors.

In some embodiments, at least one of the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13 and the fourteenth transistor M14 can be other type of transistor, there are no excessive restrictions here.

Compared with the line scanning unit 100 provided by the above embodiments of the present disclosure, the line scanning unit 100 herein has another three additional transistors, which is also able to narrow the bezels of the products, and reset the line scanning unit 100 faster and better. Since the transmission signal of this line scanning unit 100 is output through the second output terminal Ouput2, and the first output terminal Ouput1 does not need to output the transmission signal of this line scanning unit 100, so that the output function of the first output terminal Ouput1 can be optimized.

Some embodiments of the present disclosure provide a line scanning unit 100. The line scanning unit 100 includes the input module 10, the output module 20, the pull-down maintaining control module 30, the maintaining module 40, the pull-down module 50, the first reset module 60, and the second reset module 70. The input module 10 is configured to pull up the voltage of the first node PU to be at the high potential according to the $(N-1)^{th}$ transmission signal Tn−1; the N is an integer greater than 1; the output module 20 is configured to receive the first clock signal CK in response to the voltage of the first node PU being at the high potential, and outputs the output signal Ouput to the signal output terminal Ouput. The pull-down maintaining control module 30 is configured to pull up the voltage of the second node PD to be at the high potential: the maintaining module 40 is configured to pull up the voltage of the first node PU to be at the high potential according to the $(N-1)^{th}$ transmission signal Tn−1, and pull down the voltage of the signal output terminal Ouput and the voltage of the first node PU to be at the low potential in response to the voltage of the second node being at the high potential. The pull-down module 50 is configured to pull down the voltage of the second node PD to be at the low potential: the first reset module 60 is configured to pull down the voltage of the first node PU to be at the low potential according to the $(N+2)^{th}$ transmission signal Tn+2: the second reset module 70 is configured to pull down the voltage of the first node PU, the voltage of the second node PD, and the voltage of the signal output terminal Ouput to be at the low potential according to the second clock signal CLR. By respectively connecting each module of the line scanning unit 100 to at least one of the first node PU and the second node PD, the line scanning unit 100 achieves mutual restriction among modules, and realize the output function of the line scanning unit 100, and the residual charges in the line scanning unit 100 can be released, so that the whole line scanning unit can be reset faster and better, and improving the low leakage current problem of the oxide thin film transistor (TFT) and reducing the retained charges.

Figure 4:
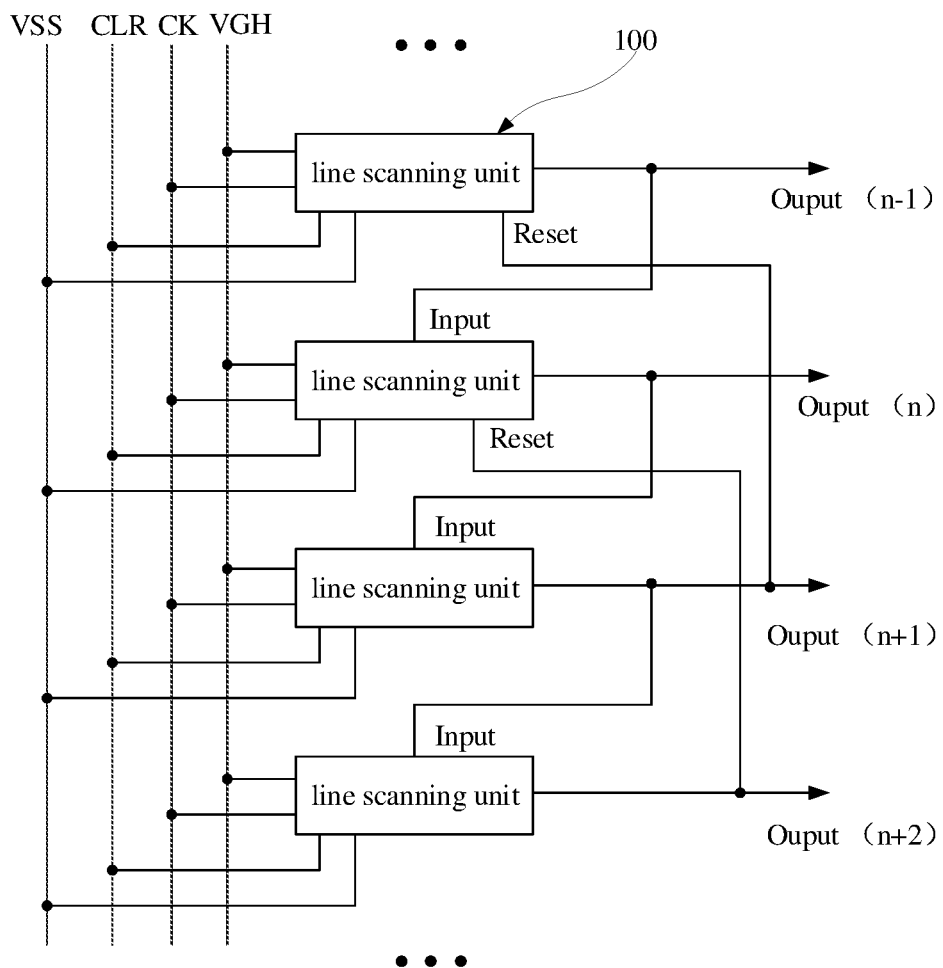
FIG. 4 is a schematic structural view of a line-scanning cascade circuit provided by some embodiments of the present disclosure.
Figure 5:
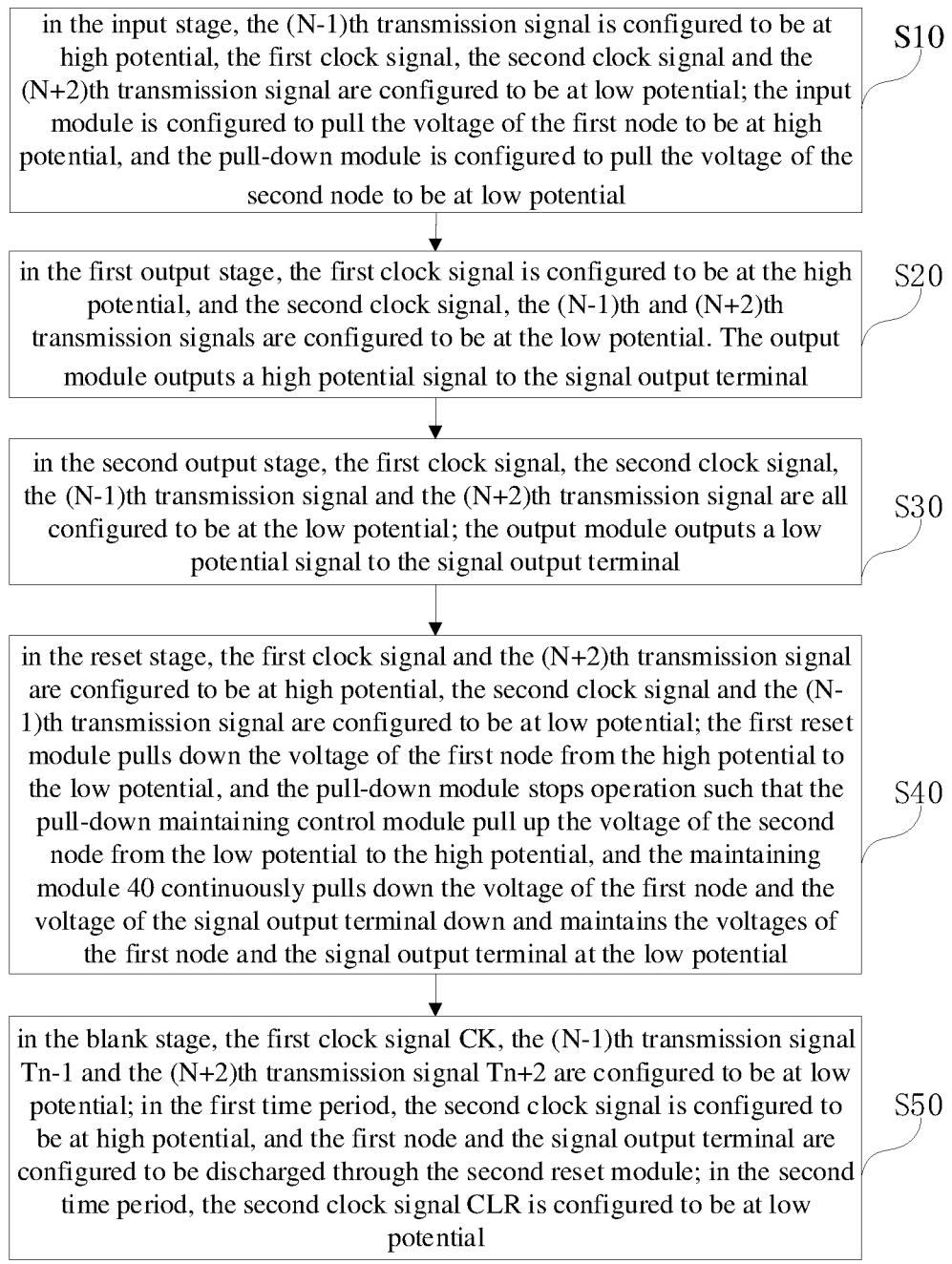
FIG. 5 is a schematic flow chart of a driving method of the line scanning unit provided by some embodiments of the present disclosure.

As shown in FIG. 4, FIG. 4 is a schematic structural view of a line-scanning cascade circuit provided by some embodiments of the present disclosure.

Some embodiments of the present disclosure provide a line-scanning cascade circuit, the line-scanning cascade circuit 200 includes a plurality of the cascaded line scanning units 100. Each line scanning unit 100 is connected to the first clock signal line CK, the second clock signal line CLR, the low-potential signal line VSS, and the high-potential signal line VGH, respectively.

The output signal Ouput of a previous line scanning unit 100 is used as the input signal Input of a current line scanning unit 100, and the reset signal Reset of each line scanning unit 100 is the output signal Ouput of a further next line scanning unit 100. That is, the input signal Input of the $N^{th}$ level of line scanning unit 100 is configured as the output signal Ouput of the $(N-1)^{th}$ level line scanning unit 100, and the reset signal Reset of the $N^{th}$ level line scanning unit 100 is the output signal Ouput of the $(N+2)^{th}$ level line scanning unit 100. The N and n are integers greater than 1. The output signals Ouput of the $(N-1)^{th}$ level to $(N+2)^{th}$ level of line scanning unit 100 may be successively expressed as Ouput (n−1), Ouput (n), Ouput (n+1), and Ouput (n+2).

In some embodiments, for the first line scanning unit 100, a frame start signal (not shown) is configured as the input signal Input since there is no previous line scanning unit 100. And since no reset signal Reset is provided to the last level of line scanning unit 100, a redundant line scanning unit (not shown) can be designed additionally to provide the reset signal Reset to the last level of line scanning unit 100.

Figure 6:
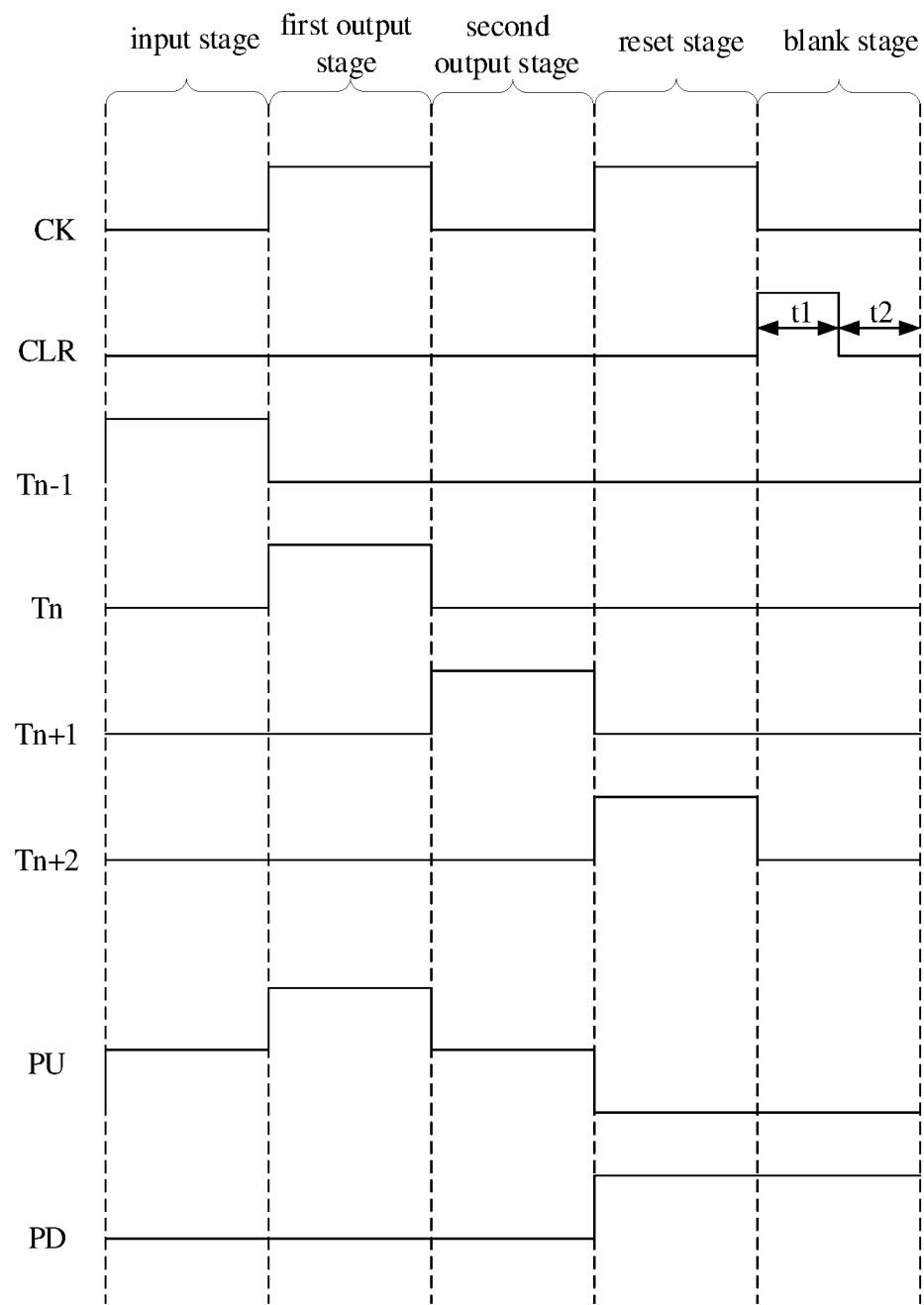
FIG. 6 is a schematic schedule chart corresponding to the line scanning unit provided by some embodiments of the present disclosure.

As shown in FIG. 1 to FIG. 6, FIG. 5 is a schematic flow chart of a driving method of the line scanning unit provided by some embodiments of the present disclosure, FIG. 6 is a schematic timing sequence corresponding to a line scanning unit provided by some embodiments of the present disclosure, a driving method of the line scanning unit 100 is provided. The line scanning unit 100 is the above-mentioned line scanning unit 100, the driving time sequence of the line scanning unit 100 may include an input stage, a first output stage, a second output stage, a reset stage and a blank stage; the blank stage may include a first time period t1 and a second time period t2.

The detailed operations of the driving method of the line scanning unit 100 may be as follows.

At block S10, the method may include that in the input stage, the $(N-1)^{th}$ transmission signal is configured to be at high potential, the first clock signal, the second clock signal and the $(N+2)^{th}$ transmission signal are configured to be at low potential: the input module is configured to pull the voltage of the first node to be at high potential, and the pull-down module is configured to pull the voltage of the second node to be at low potential.

In the input stage, the $(N-1)^{th}$ transmission signal Tn−1 is configured to be at high potential, the input module 10, the pull-down maintaining control module 30, and the pull-down module 50 operates. The constant-voltage high-potential signal VGH is configured to charge the output module 20 through the input module 10, and pull up the voltage of the first node PU to be at high potential. The pull-down module 50 quickly pulls down the voltage of the second node PD to be at low potential, and thus, even if the pull-down maintaining control module 30 operates, the maintaining module 40 is still in a non-operating state to maintain the first node PU at high potential. As long as the voltage of the second node PD is at low potential, the maintaining module 40 is in the non-operating state.

At block S20, the method may include that in the first output stage, the first clock signal is configured to be at the high potential, and the second clock signal, the $(N-1)^{th}$ and $(N+2)^{th}$ transmission signals are configured to be at the low potential. The output module outputs a high potential signal to the signal output terminal.

When the first clock signal CK is configured to be at high potential, and the first node PU is maintained at high potential, the output module 20 operates, and the first clock signal CK outputs the high potential signal to the signal output terminal through the output module 20.

At block S30, the method may include that in the second output stage, the first clock signal, the second clock signal, the $(N-1)^{th}$ transmission signal and the $(N+2)^{th}$ transmission signal are all configured to be at the low potential: the output module outputs a low potential signal to the signal output terminal.

When the first clock signal CK is configured to be at low potential, and the first node PU is maintained at high potential, the output module 20 operates, and the first clock signal CK outputs the low potential signal to the output terminal Ouput through the output module 20, and the second node PD remains being at the low potential.

At block S40, the method may include that in the reset stage, the first clock signal and the $(N+2)^{th}$ transmission signal are configured to be at high potential, the second clock signal and the $(N-1)^{th}$ transmission signal are configured to be at the low potential: the first reset module pulls down the voltage of the first node from the high potential to the low potential, and the pull-down module stops operation such that the pull-down maintaining control module pull up the voltage of the second node from the low potential to the high potential, and the maintaining module continuously pulls down the voltage of the first node and the voltage of the signal output terminal down and maintains the voltages of the first node and the signal output terminal at the low potential.

When the $(N+2)^{th}$ transmission signal is configured to be at high potential, the first reset module 60 operates, so that the voltage of the first node PU is pulled down from the high potential to the low potential. When the first node PU is configured to be at low potential, the output module 20 stops operation, and the pull-down maintaining control module 30 operates, the constant-voltage high-potential signal VGH pulls up the second node PD to be at the high potential through the pull-down maintaining control module 30, making the maintaining module 40 operate. And the maintaining module 40 continuously pulls down the voltage of the first node PU and the voltage of the signal output terminal Ouput and maintains the voltage of the first node PU and the signal output terminal Ouput at the low potential.

Compared with that in the related art, in the driving method of the line scanning unit 100 provided by some embodiments of the present disclosure, the reset signal Reset is the $(N+2)^{th}$ transmission signal Tn+2, instead of the $(N+1)^{th}$ transmission signal Tn+1. In other words, in some embodiments of the present disclosure, the output signal Ouput of the previous line scanning unit 100 is used as the input signal Input of this line scanning unit 100, and the reset signal Reset of each line scanning unit 100 is get from the output signal Ouput of a further next second line scanning unit 100.

At block S50, the method may include that in the blank stage, the first clock signal CK, the $(N-1)^{th}$ transmission signal Tn-1 and the $(N+2)^{th}$ transmission signal Tn+2 are configured to be at low potential: in the first time period, the second clock signal is configured to be at high potential, and the first node and the signal output terminal are configured to be discharged through the second reset module: in the second time period, the second clock signal CLR is configured to be at low potential. In the first time period t1 of the blank stage, the second clock signal CLR is configured to be at high potential, the second reset module 70 operates, and the first node PU and the signal output terminal Ouput are discharged through the second reset module 70 until the residual charges in the line scanning unit 100 are cleared, which realizes the reset and clear of the entire line scanning unit 100.

The durations of the first time period t1 and the second time period t2 are not limited here. The second clock signal CLR is at low potential before a next frame starts to prevent the first node PU from being discharged through the second reset module 70 when the next frame starts.

The pull-down maintaining control module 30 operates in the input stage, the first output stage, the second output stage, the reset stage, and the blank stage.

EMBODIMENT I

When the line scanning unit 100 is the line scanning unit 100 provided by some embodiments of the present disclosure, the driving method of the line scanning unit 100 may include the following.

In the input stage, the $(N-1)^{th}$ transmission signal Tn-1 is configured to be at the high potential, the first transistor M1, the second transistor M2 and the fifth transistor M5 are all conducted. The constant-voltage high-potential signal VGH charges the capacitor C through the first transistor M1, and pulls up the voltage of the first node PU to be at a first high potential. The second transistor M2 quickly pulls down the voltage of the second node PD to be at the low potential, so that even if the fifth transistor M5 is conducted, the maintaining module 40 is still in the non-operating state, and the capacitor C fails to be discharged through the first node PU and the maintaining module 40 such that the first node PU is maintained at the high potential. As long as the second node PD is at the low potential state, the maintaining module 40 is in the non-operating state. And when the first node PU is at the high potential, the third transistor M3 is conducted, and the third transistor M3 continuously pulls down the voltage of the second node PD and maintains it at the low potential.

In the driving method provided by some embodiments of the present disclosure, transistors that are not emphasized as being conducted are indicated to be unconducted.

In the first output stage, the first clock signal is configured to be at the high potential, the first node PU remains at the high potential, the sixth transistor M6 is conducted, the first clock signal CK outputs the high potential signal to the first output terminal Ouput through the sixth transistor M6, and the voltage of the first node PU hops from the first high potential to a second high potential due to the generation of parasitic capacitance. The second high potential is configured to be higher than the first high potential. The $(N-1)^{th}$ transmission signal Tn-1 is at the low potential, the second transistor M2 and the first transistor M1 are unconducted. And since the first node PU is at the high potential, the third transistor M3 is constantly conducted, the third transistor M3 constantly pulls down the voltage of the second node PD and keeps the voltage of the second node PD at the low potential.

In the second output stage, the first clock signal CK is at the low potential state, and the voltage of the first node PU hops from the second high potential to the first high potential, that is, the first node PU is maintained at the high potential, the sixth transistor M6 and the third transistor M3 continue to be conducted, and the first clock signal CK outputs the low potential signal through the sixth transistor M6 to the first output terminal Ouput1. And the second node PD continues to be remained at the low potential.

The $(N+1)^{th}$ transmission signal Tn+1 is at the high potential only in the second output stage.

In the reset stage, the $(N+2)^{th}$ transmission signal is at the high potential, the fourth transistor M4 is conducted, the capacitor C is discharged through the first node PU and the fourth transistor M4, so that the voltage of the first node PU is pulled down from the high potential to the high potential. The first node PU is at the low potential, the third transistor M3 and the sixth transistor M6 are unconducted, the fifth transistor M5 is conducted, the constant-voltage high-potential signal VGH pulls up the voltage of the second node PD to be at the high potential through the fifth transistor M5, so that the seventh transistor M7 and the eighth transistor M8 are conducted. The seventh transistor M7 continuously pulls down the voltage of the first output terminal Ouput1 and keeps the voltage of the first output terminal Ouput1 at the low potential, and the eighth transistor M8 continuously pulls down the voltage of the first node PU and keeps the voltage of the first node PU at the low potential.

In the first time period t1 of the blank stage, the second clock signal CLR is at the high potential, the ninth transistor M9, the tenth transistor M10 and the eleventh transistor M11 are all conducted, the first node PU is discharged through the ninth transistor M9, and the first output terminal Ouput1 is discharged through the tenth transistor M10, the second node PD is discharged through the eleventh transistor M11, until the residual charges in the circuit are cleared, and the whole line scanning unit 100 is reset and cleared.

In the input stage, the first output stage, the second output stage, the reset stage, and the blank stage, the fifth transistor M5 is conducted.

EMBODIMENT II

When the line scanning unit 100 is the line scanning unit 100 provided by another some embodiments of the present disclosure, the driving method of the line scanning unit 100 may be as follows.

In the input stage, the $(N-1)^{th}$ transmission signal Tn−1 is at the high potential, and the first transistor M1, the second transistor M2 and the fifth transistor M5 are all conducted. The constant-voltage high-potential signal VGH charges the capacitor C through the first transistor M1, and pulls up the voltage of the first node PU to the first high potential. The second transistor M2 quickly pulls down the voltage of the second node PD to the low potential, so that even if the fifth transistor M5 is conducted, the maintaining module 40 is still in the non-operating state, and the capacitor C cannot be discharged through the first node PU and maintaining module 40 to keep the first node PU at the high potential. As long as the second node PD is at the low potential, the maintaining module 40 is in the non-operating state. When the first node PU is at the high potential, the third transistor M3 is conducted, and the third transistor M3 continuously pulls down the voltage of the second node PD and keeps the voltage of the second node PD at the low potential.

In the first output stage, the first clock signal CK is configured to be at the high potential, the first node PU is kept at the high potential, the sixth transistor M6 and the twelfth transistor M12 are conducted, and the first clock signal CK outputs the high potential signal to the first output terminal Ouput1 through the sixth transistor M6, the first clock signal CK outputs the high potential signal to the second output Ouput2 through the twelfth transistor M12, and the voltage of the first node PU hops from the first high potential to the second high potential due to the generation of the parasitic capacitance. The second high potential is configured to be higher than the first high potential. The $(N-1)^{th}$ transmission signal Tn−1 is at the low potential, and the second transistor M2 and the first transistor M1 are unconducted. Since the first node PU is at the high potential, the third transistor M3 is continuously conducted, and the third transistor M3 continues to pull down the voltage of the second node PD and keeps the voltage of the second node PD at the low potential.

In the second output stage, the first clock signal CK is configured to be at the low potential, and the voltage of the first node PU hops from the second high potential to the first high potential, that is, the first node PU remains at the high potential, and the twelfth transistor M12, the sixth transistor M6, and the third transistor M3 continue to be conducted, the first clock signal CK outputs the low potential signal to the first output terminal Ouput1 through the sixth transistor M6, and the first clock signal CK outputs the low potential signal to the second output terminal Ouput2 through the twelfth transistor M12, and the second node PD continues to be at the low potential.

The $(N+1)^{th}$ transmission signal Tn+1 is at the high potential only in the second output stage.

In the reset stage, the $(N+2)^{th}$ transmission signal Tn+2 is at the high potential, the fourth transistor M4 is conducted, and the capacitor C is successively discharged through the first node PU and the fourth transistor M4, so that voltage of the first node PU is pulled down from the high potential to the low potential. Since the first node PU is at the low potential, the third transistor M3 and the sixth transistor M6 are unconducted, the fifth transistor M5 is conducted, and the constant-voltage high-potential signal VGH pulls the voltage of the second node PD to be at the high potential through the fifth transistor M5, so that the seventh transistor M7, the eighth transistor M8, and the thirteenth transistor M13 are conducted. The seventh transistor M7 continuously pulls down the voltage of the first output terminal Ouput1 and keeps the voltage of the first output terminal Ouput1 at the low potential, the eighth transistor M8 continuously pulls down the voltage of the first node PU and keeps it at the low potential, and the thirteenth transistor M13 continuously pulls down the voltage of the second output terminal Ouput2 and keeps the voltage of the second output terminal Ouput2 at the low potential.

In the first time period t1 of the blank stage, the second clock signal CLR is configured to be at the high potential, the ninth transistor M9, the tenth transistor M10, the eleventh transistor M11, and the fourteenth transistor M14 are all conducted, the first node PU is discharged through the ninth transistor M9, and the first output terminal Ouput1 is discharged through the tenth transistor M10. The second node PD is discharged through the eleventh transistor M11, and the second output terminal Ouput2 is discharged through the fourteenth transistor M14, until the residual charges in line scanning unit 100 are cleared, and the whole line scanning unit 100 is reset and cleared.

In the input stage, the first output stage, the second output stage, the reset stage and the blank stage, the fifth transistor M5 are conducting.

The above illustrates only the embodiments of the disclosure, and does not limit the protection scope of the present disclosure. Any equivalent structure or equivalent process conversion made by using the description and drawings of the present disclosure, or directly or indirectly used in other related technical fields, are all included in the protection scope of the present disclosure in the same way.

What is claimed is:

1. A line scanning unit, comprising:
   an input module, configured to pull-up a voltage of a first node to be at high potential according to a $(N-1)^{th}$ transmission signal; the N being an integer greater than 1;
   an output module, configured to receive a first clock signal and output an output signal via a signal output terminal in response to the voltage of the first node being at high potential;
   a pull-down maintenance control module, configured to pull-up a voltage of a second node to be at high potential;
   a maintaining module, configured to pull-down a voltage of the signal output terminal and the voltage of the first node to be at low potential in response to the voltage of the second node being at high potential;
   a pull-down module, configured to pull-down the voltage of the second node to be at low potential;
   a first reset module, configured to pull-down the voltage of the first node to be at low potential according to a $(N+2)^{th}$ transmission signal;
   a second reset module, configured to pull-down the voltage of the first node, the voltage of the second node, and the voltage of the signal output terminal to be at low potential according to a second clock signal.

2. The line scanning unit according to claim 1, wherein a control terminal of the input module receives the $(N-1)^{th}$ transmission signal, a input terminal of the input module receives a constant-voltage high-potential signal, and a output terminal of the input module is connected to the first node;
   a control terminal of the output module is connected to the first node, an input terminal of the output module receives the first clock signal, and an output terminal of the output module is connected to the signal output terminal;
   a control terminal of the pull-down maintaining control module receives the constant-voltage high-potential signal, an input terminal of the pull-down maintaining control module receives the constant-voltage high-potential signal, and an output terminal of the pull-down maintenance control module is connected to the second node;
   a control terminal of the maintaining module is connected to the second node, an input terminal of the maintaining module is connected to the signal output terminal and the first node, and an output terminal of the maintaining module receives a constant-voltage low-potential signal;
   a control terminal of the pull-down module is connected to the first node and receives the $(N-1)^{th}$ transmission signal, an input terminal of the pull-down module is connected to the second node, and an output terminal of the pull-down module receives the constant-voltage low-potential signal;
   a control terminal of the first reset module receives the $(N+2)^{th}$ transmission signal, an input terminal of the first reset module is connected to the first node, and an output terminal of the first reset module receives the constant-voltage low-potential signal;
   a control terminal of the second reset module receives the second clock signal, an input terminal of the second reset module is connected to the first node and the signal output terminal, and an output terminal of the second reset module receives the constant-voltage low-potential signal.

3. The line scanning unit according to claim 1, wherein the input module comprises a first transistor, wherein a gate of the first transistor receives the $(N-1)^{th}$ transmission signal, a drain of the first transistor receives the constant-voltage high-potential signal, and a source of the first transistor is connected to the first node;
   the pull-down module comprises a second transistor and a third transistor, wherein a gate of the second transistor receives the $(N-1)^{th}$ transmission signal, a drain of the second transistor is connected to the second node, and a source of the second transistor receives the constant-voltage low-potential signal; a gate of the third transistor is connected to the first node, a drain of the third transistor is connected to the second node, and a source of the third transistor receives the constant-voltage low-potential signal;
   the first reset module comprises a fourth transistor, wherein a gate of the fourth transistor receives the $(N+2)^{th}$ transmission signal, a drain of the fourth transistor is connected to the first node, and a source of the fourth transistor receives the constant-voltage low-potential signal;
   the pull-down maintaining control module comprises a fifth transistor, wherein a gate and a drain of the fifth transistor receive the constant-voltage high-potential signal, and a source of the fifth transistor is connected to the second node.

4. The line scanning unit according to claim 3, wherein the signal output terminal comprises a first output terminal, and the first output terminal is configured to output a $N^{th}$ gate driving signal.

5. The line scanning unit according to claim 4, wherein the output module comprises a sixth transistor and a capacitor, wherein a gate of the sixth transistor is connected to the first node, a drain of the sixth transistor receives the first clock signal, a source of the sixth transistor is connected to the first output terminal; one terminal of the capacitor is connected to the first node, the other terminal of the capacitor is connected to the first output terminal;
   the maintaining module comprises a seventh transistor and an eighth transistor, wherein a gate of the seventh transistor is connected to the second node, a drain of the seventh transistor is connected to the first output terminal, and a source of the seventh transistor receives the constant-voltage low-potential signal; a gate of the eighth transistor is connected to the second node, a drain of the eighth transistor is connected to the first node, and a source of the eighth transistor receives the constant-voltage low-potential signal;
   the second reset module comprises a ninth transistor, a tenth transistor, and an eleventh transistor, wherein a gate of the ninth transistor receives the second clock signal, a drain of the ninth transistor is connected to the first node, and a source of the ninth transistor receives the constant-voltage low-potential signal; a gate of the tenth transistor receives the second clock signal, a drain of the tenth transistor is connected to the first output terminal, and a source of the tenth transistor receives the constant-voltage low-potential signal; a gate of the eleventh transistor receives the second clock signal, a drain of the eleventh transistor is connected to the second node, and a source of the eleventh transistor receives the constant-voltage low-potential signal.

6. The line scanning unit according to claim 5, wherein the signal output terminal further comprises a second output terminal, the second output terminal is configured to output a $N^{th}$ transmission signal.

7. The line scanning unit according to claim 6, wherein the output module further comprises a twelfth transistor, wherein a gate of the twelfth transistor is connected to the first node, a drain of the twelfth transistor receives the first clock signal, and a source of the twelfth transistor is connected to the first node and is connected to the second output terminal through the first node;
   the maintaining module further comprises a thirteenth transistor, wherein a gate of the thirteenth transistor is connected to the second node, a drain of the thirteenth transistor is connected to the second output terminal, and a source of the thirteenth transistor receives the constant-voltage low-potential signal;
   the second reset module further comprises a fourteenth transistor, wherein a gate of the fourteenth transistor receives the second clock signal, a drain of the fourteenth transistor is connected to the second output terminal, and a source of the fourteenth transistor receives the constant-voltage low-potential signal.

8. The line scanning unit according to claim 7, wherein the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, and the fourteenth transistor are oxide thin film transistors.

9. A driving method for a line scanning unit, wherein the line scanning unit is according to claim 1 and has a driving time sequence comprising an input stage, a first output stage, a second output stage, a reset stage, and a blank stage, and the blank stage comprises a first time period and a second time period;

the driving method comprises:
in the input stage, the $(N-1)^{th}$ transmission signal is configured to be at high potential, the first clock signal, the second clock signal, and the $(N+2)^{th}$ transmission signal are configured to be at low potential, the input module is configured to pull-up the voltage of the first node to be at high potential, and the pull-down module is configured to pull-down the voltage of the second node to be at low potential;

in the first output stage, the first clock signal is configured to be at high potential, the second clock signal, the $(N-1)^{th}$ transmission signal, and the $(N+2)^{th}$ transmission signal are configured to be at low potential, and the output module is configured to output a high potential signal to the signal output terminal;

in the second output stage, the first clock signal, the second clock signal, the $(N-1)^{th}$ transmission signal, and the $(N+2)^{th}$ transmission signal are configured to be low potential; and the output module is configured to output a low potential signal to the signal output terminal;

in the reset stage, the first clock signal and the $(N+2)^{th}$ transmission signal are configured to be at high potential, and the second clock signal and the $(N-1)^{th}$ transmission signal are configured to be at low potential; the first reset module is configured to pull-down the voltage of the first node from the high potential to the low potential, the pull-down module is configured to stop operation such that the pull-down maintaining control module pulls-up the voltage of the second node from the low potential to the high potential, and the maintaining module is configured to continuously pull down and maintain the voltage of the first node and the voltage of the signal output terminal be at low potential;

in the blank stage, the first clock signal, the $(N-1)^{th}$ transmission signal, and the $(N+2)^{th}$ transmission signal are configured to be at low potential; in the first time period, the second clock signal is configured to be at high potential, and the first node and the signal output terminal are configured to be discharged through the second reset module; in the second time period, the second clock signal is configured to be at low potential.

10. A line-scanning cascade circuit, comprising a plurality of line scanning units, wherein each of the line scanning units comprises:

an input module, configured to pull-up a voltage of a first node to be at high potential according to a $(N-1)^{th}$ transmission signal; the N being an integer greater than 1;

an output module, configured to receive a first clock signal and output an output signal via a signal output terminal in response to the voltage of the first node being at high potential;

a pull-down maintenance control module, configured to pull-up a voltage of a second node to be at high potential;

a maintaining module, configured to pull-down a voltage of the signal output terminal and the voltage of the first node to be at low potential in response to the voltage of the second node being at high potential;

a pull-down module, configured to pull-down the voltage of the second node to be at low potential;

a first reset module, configured to pull-down the voltage of the first node to be at low potential according to a $(N+2)^{th}$ transmission signal;

a second reset module, configured to pull-down the voltage of the first node, the voltage of the second node, and the voltage of the signal output terminal to be at low potential according to a second clock signal.

11. The line-scanning cascade circuit according to claim 10, wherein a control terminal of the input module receives the $(N-1)^{th}$ transmission signal, a input terminal of the input module receives a constant-voltage high-potential signal, and a output terminal of the input module is connected to the first node;

a control terminal of the output module is connected to the first node, an input terminal of the output module receives the first clock signal, and an output terminal of the output module is connected to the signal output terminal;

a control terminal of the pull-down maintaining control module receives the constant-voltage high-potential signal, an input terminal of the pull-down maintaining control module receives the constant-voltage high-potential signal, and an output terminal of the pull-down maintenance control module is connected to the second node;

a control terminal of the maintaining module is connected to the second node, an input terminal of the maintaining module is connected to the signal output terminal and the first node, and an output terminal of the maintaining module receives a constant-voltage low-potential signal;

a control terminal of the pull-down module is connected to the first node and receives the $(N-1)^{th}$ transmission signal, an input terminal of the pull-down module is connected to the second node, and an output terminal of the pull-down module receives the constant-voltage low-potential signal;

a control terminal of the first reset module receives the $(N+2)^{th}$ transmission signal, an input terminal of the first reset module is connected to the first node, and an output terminal of the first reset module receives the constant-voltage low-potential signal;

a control terminal of the second reset module receives the second clock signal, an input terminal of the second reset module is connected to the first node and the signal output terminal, and an output terminal of the second reset module receives the constant-voltage low-potential signal.

12. The line-scanning cascade circuit according to claim 9, wherein the input module comprises a first transistor, wherein a gate of the first transistor receives the $(N-1)^*$ transmission signal, a drain of the first transistor receives a constant-voltage high-potential signal, and a source of the first transistor is connected to the first node; the pull-down module comprises a second transistor and a third transistor, wherein a gate of the second transistor receives the $(N-1)^*$ transmission signal, a drain of the second transistor is connected to the second node, and a source of the second transistor receives a constant-voltage low-potential signal; a gate of the third transistor is connected to the first node, a drain of the third transistor is connected to the second node, and a source of the third transistor receives the constant voltage low-potential signal; the first reset module comprises a fourth transistor, wherein a gate of the fourth transistor receives the (N+2)* transmission signal, a drain of the fourth transistor is connected to the first node, and a source of the fourth transistor receives the constant-voltage low-potential signal; the pull-down maintaining control module comprises a fifth transistor, wherein a gate and a drain of the fifth transistor receive the constant-voltage high-potential signal, and a source of the fifth transistor is connected to the second node.

13. The line-scanning cascade circuit according to claim 12, wherein the signal output terminal comprises a first output terminal, and the first output terminal is configured to output a $N^{th}$ gate driving signal.

14. The line-scanning cascade circuit according to claim 13, wherein the output module comprises a sixth transistor and a capacitor, wherein a gate of the sixth transistor is connected to the first node, a drain of the sixth transistor receives the first clock signal, a source of the sixth transistor is connected to the first output terminal; one terminal of the capacitor is connected to the first node, the other terminal of the capacitor is connected to the first output terminal;

the maintaining module comprises a seventh transistor and an eighth transistor, wherein a gate of the seventh transistor is connected to the second node, a drain of the seventh transistor is connected to the first output terminal, and a source of the seventh transistor receives the constant-voltage low-potential signal; a gate of the eighth transistor is connected to the second node, a drain of the eighth transistor is connected to the first node, and a source of the eighth transistor receives the constant-voltage low-potential signal;

the second reset module comprises a ninth transistor, a tenth transistor, and an eleventh transistor, wherein a gate of the ninth transistor receives the second clock signal, a drain of the ninth transistor is connected to the first node, and a source of the ninth transistor receives the constant-voltage low-potential signal; a gate of the tenth transistor receives the second clock signal, a drain of the tenth transistor is connected to the first output terminal, and a source of the tenth transistor receives the constant-voltage low-potential signal; a gate of the eleventh transistor receives the second clock signal, a drain of the eleventh transistor is connected to the second node, and a source of the eleventh transistor receives the constant-voltage low-potential signal.

15. The line-scanning cascade circuit according to claim 14, wherein the signal output terminal further comprises a second output terminal, the second output terminal is configured to output a $N^{th}$ transmission signal.

16. The line-scanning cascade circuit according to claim 15, wherein the output module further comprises a twelfth transistor, wherein a gate of the twelfth transistor is connected to the first node, a drain of the twelfth transistor receives the first clock signal, and a source of the twelfth transistor is connected to the first node and is connected to the second output terminal through the first node;

the maintaining module further comprises a thirteenth transistor, wherein a gate of the thirteenth transistor is connected to the second node, a drain of the thirteenth transistor is connected to the second output terminal, and a source of the thirteenth transistor receives the constant-voltage low-potential signal;

the second reset module further comprises a fourteenth transistor, wherein a gate of the fourteenth transistor receives the second clock signal, a drain of the fourteenth transistor is connected to the second output terminal, and a source of the fourteenth transistor receives the constant-voltage low-potential signal.

17. The line-scanning cascade circuit according to claim 16, wherein the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, and the fourteenth transistor are oxide thin film transistors.

18. The line-scanning cascade circuit according to claim 10, wherein each of the line scanning units is connected to a first clock signal line, a second clock signal line, a low-potential signal line and a high-potential signal line.

19. The line-scanning cascade circuit according to claim 18, wherein an output signal of a previous line scanning unit in the line scanning units is used as an input signal of a current line scanning unit in the line scanning units, and a reset signal of each of the line scanning units is an output signal of a further next second line scanning unit in the line scanning units.

20. The line-scanning cascade circuit according to claim 19, wherein a frame start signal is configured as an input signal of the first one in the line scanning units; a redundant line scanning unit is configured to provide a reset signal to the last one in the line scanning units.

* * * * *